United States Patent
Kagawa et al.

(10) Patent No.: US 10,401,671 B2
(45) Date of Patent: Sep. 3, 2019

(54) LIQUID CRYSTAL PANEL HAVING TOUCH SENSOR FUNCTION

(71) Applicant: SHARP KABUSHIKI KAISHA, Sakai, Osaka (JP)

(72) Inventors: Haruhito Kagawa, Sakai (JP); Kohji Ogata, Sakai (JP); Naoki Yada, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/778,472

(22) PCT Filed: Nov. 21, 2016

(86) PCT No.: PCT/JP2016/084492
§ 371 (c)(1),
(2) Date: May 23, 2018

(87) PCT Pub. No.: WO2017/090560
PCT Pub. Date: Jun. 1, 2017

(65) Prior Publication Data
US 2018/0364511 A1    Dec. 20, 2018

(30) Foreign Application Priority Data

Nov. 24, 2015 (JP) .................. 2015-228437

(51) Int. Cl.
*G02F 1/1333*     (2006.01)
*G02F 1/133*      (2006.01)
(Continued)

(52) U.S. Cl.
CPC .......... *G02F 1/13338* (2013.01); *G02F 1/133* (2013.01); *G02F 1/1333* (2013.01);
(Continued)

(58) Field of Classification Search
CPC .... G02F 1/13338; G02F 1/133; G02F 1/1333; G02F 1/1335; G02F 1/133514;
(Continued)

(56) References Cited

U.S. PATENT DOCUMENTS

| 2011/0025969 A1* | 2/2011 | Chen ................ G02F 1/13338 349/139 |
| 2012/0188202 A1 | 7/2012 | Tsujino et al. |
| 2016/0231849 A1 | 8/2016 | Watazu et al. |

FOREIGN PATENT DOCUMENTS

| JP | 2012-079135 A | 4/2012 |
| JP | 2012-252025 A | 12/2012 |

(Continued)

*Primary Examiner* — Amare Mengistu
*Assistant Examiner* — Gloryvid Figueroa-Gibson
(74) *Attorney, Agent, or Firm* — ScienBiziP, P.C.

(57) ABSTRACT

A liquid crystal panel capable of sensing a touch includes a TFT substrate 1; a CF substrate 2 arranged so as to be opposed to the TFT substrate 1; a liquid crystal layer 3 interposed between the TFT substrate 1 and the CF substrate 2; touch drive electrodes Tx arranged on a liquid crystal layer 3 side of the CF substrate 2; touch detection electrodes Rx arranged on a side of the CF substrate 2 opposite to the liquid crystal layer 3; a pressing detection electrode Fx arranged on a liquid crystal layer 3 side of the TFT substrate 1; and a control unit that supplies a driving signal to the touch drive electrodes Tx and detects detection signals output from the touch detection electrodes Rx, thereby detecting a touch position, and that detects amounts of change in electrostatic capacitances generated between the touch drive electrodes Tx and the pressing detection electrode Fx, thereby detecting pressing when touched.

5 Claims, 11 Drawing Sheets

(51) Int. Cl.
  *G02F 1/1335* (2006.01)
  *G02F 1/1343* (2006.01)
  *G06F 3/044* (2006.01)
  *G06F 3/041* (2006.01)
  *G06F 3/047* (2006.01)
  *H01L 27/12* (2006.01)

(52) U.S. Cl.
  CPC .......... *G02F 1/1335* (2013.01); *G02F 1/1343* (2013.01); *G02F 1/133514* (2013.01); *G02F 1/134309* (2013.01); *G06F 3/044* (2013.01); *G06F 3/047* (2013.01); *G06F 3/0412* (2013.01); *G06F 3/0414* (2013.01); *G06F 3/0416* (2013.01); *H01L 27/124* (2013.01); *G06F 2203/04105* (2013.01)

(58) Field of Classification Search
  CPC ............. G02F 1/1343; G02F 1/134309; G06F 3/0412; G06F 3/0414; G06F 3/0416; G06F 3/044; G06F 3/047; G06F 2203/04105; H01L 27/124
  USPC ....................................................... 345/173
  See application file for complete search history.

(56) References Cited

FOREIGN PATENT DOCUMENTS

JP   2014-194591 A   10/2014
JP      5722954 B2    5/2015

\* cited by examiner

LIQUID CRYSTAL PANEL HAVING TOUCH SENSOR FUNCTION

TECHNICAL FIELD

The present invention relates to a liquid crystal panel capable of sensing a touch.

BACKGROUND ART

A display device having a touch sensor function that is capable of not only detecting a touch position but also detecting the pressing at the touched position has been known. In the touch panel disclosed in Patent Document 1, electrodes for detecting pressing are provided in addition to the electrodes for detecting a touch position, and the pressing is detected based on electrostatic capacitances between the electrodes for detecting pressing and a ground plate opposed thereto.

PRIOR ART DOCUMENT

Patent Document

Patent Document 1: JP-A-2014-194591

SUMMARY OF THE INVENTION

Problem to be Solved by the Invention

Figure 3:
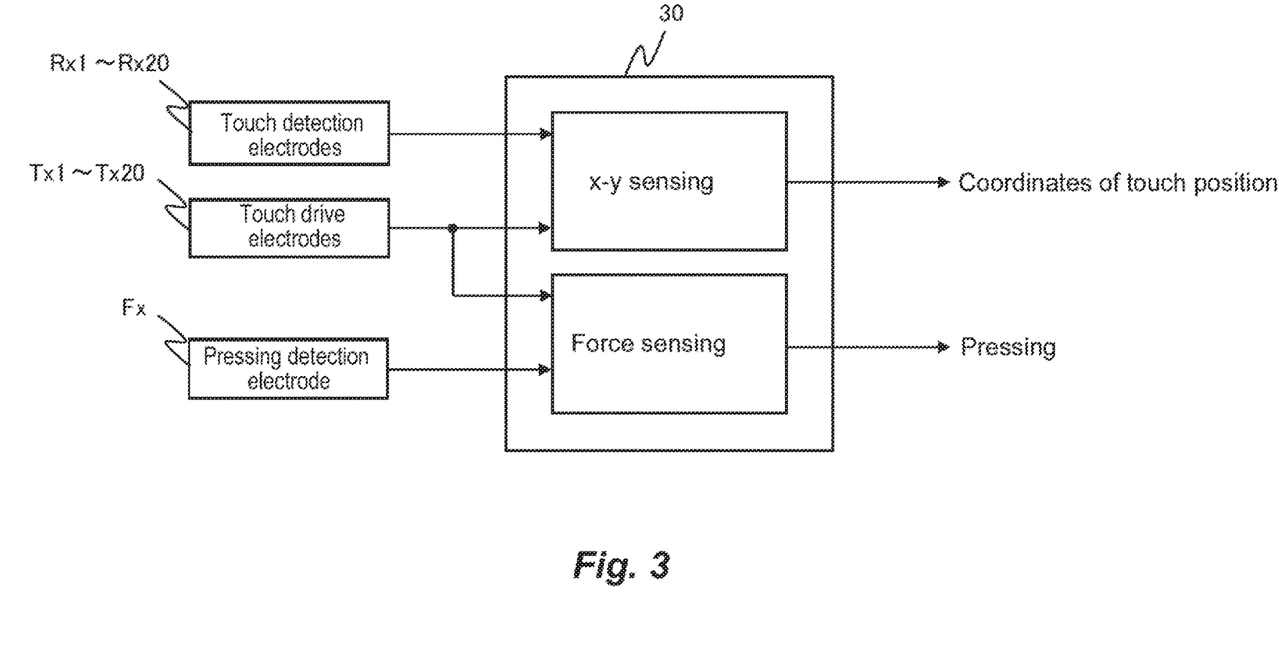
FIG. 3 is a diagram for explaining x-y sensing for detecting a touch position, and force sensing for detecting pressing when touched.

In the case of the touch panel disclosed in Patent Document 1, a space part (air layer) is provided between a pressure detection plate on which electrodes for detecting pressing are arranged and the ground plate as illustrated in FIG. 3, and interface reflection in the space part impairs the display quality.

It is an object of the present invention to provide a liquid crystal panel capable of sensing a touch that can detect a touch position and pressing without impairing the display quality.

Means to Solve the Problem

A liquid crystal panel capable of sensing a touch in one embodiment of the present invention includes: a first substrate; a second substrate arranged so as to be opposed to the first substrate; a liquid crystal layer interposed between the first substrate and the second substrate; touch drive electrodes arranged on a liquid crystal layer side of the second substrate; a touch detection electrode arranged on a side of the second substrate opposite to the liquid crystal layer; a pressing detection electrode arranged on a liquid crystal layer side of the first substrate: and a control unit that supplies a driving signal to the touch drive electrodes, and detects a detection signal output from the touch detection electrode, thereby detecting a touch position, and that detects amounts of change in electrostatic capacitances generated between the touch drive electrodes and the pressing detection electrode, thereby detecting pressing when touched.

Effect of the Invention

According to the disclosure of the present embodiment, a pressing detection electrode for detecting pressing is arranged on the liquid crystal layer side of the first substrate, and amounts of change in electrostatic capacitances generated between the pressing detection electrode and the touch drive electrodes arranged on the liquid crystal layer side of the second substrate are detected, whereby pressing when touched is detected. Since the configuration is such that no air layer is present between the pressing detection electrode and the touch drive electrodes, and the liquid crystal layer is interposed therebetween, a problem of interface reflection caused by the presence of the air layer by no means occurs. This makes it possible to detect a touch position and pressing without impairing display quality.

MODE FOR CARRYING OUT THE INVENTION

A liquid crystal panel capable of sensing a touch in one embodiment of the present invention includes: a first substrate; a second substrate arranged so as to be opposed to the first substrate; a liquid crystal layer interposed between the first substrate and the second substrate; touch drive electrodes arranged on a liquid crystal layer side of the second substrate; a touch detection electrode arranged on a side of the second substrate opposite to the liquid crystal layer; a pressing detection electrode arranged on a liquid crystal layer side of the first substrate; and a control unit that supplies a driving signal to the touch drive electrodes, and detects a detection signal output from the touch detection electrode, thereby detecting a touch position, and that detects amounts of change in electrostatic capacitances generated between the touch drive electrodes and the pressing detection electrode, thereby detecting pressing when touched (the first configuration).

According to the first configuration, a pressing detection electrode for detecting pressing is arranged on the liquid crystal layer side of the first substrate, and amounts of change in electrostatic capacitances generated between the pressing detection electrode and the touch drive electrodes arranged on the liquid crystal layer side of the second substrate are detected, whereby pressing when touched is detected. Since the configuration is such that no air layer is present between the pressing detection electrode and the touch drive electrodes, and the liquid crystal layer is interposed therebetween, a problem of interface reflection caused by the presence of the air layer by no means occurs. Besides, this liquid crystal panel has a thickness that is almost equal to the thickness of a liquid crystal panel that does not have a pressing detection function. This makes it possible to detect a touch position and pressing without impairing display quality.

The first configuration may further include a conversion circuit that covers the amounts of change in the electrostatic capacitances generated between the touch drive electrodes and the pressing detection electrode, to voltage change amounts, wherein the control unit detects pressing when touched, based on the voltage change amounts output from the conversion circuit (the second configuration).

According to the second configuration, a conversion circuit that converts amounts of charge in electrostatic capacitances to voltage change amounts is included, which makes it possible to detect pressing when touched, based on the voltage change amounts that can be detected easily.

The second configuration may be further characterized in that when detecting pressing when touched, the control unit detects amounts of change in the electrostatic capacitances generated between the touch drive electrodes and the pressing detection electrode, during a period while the touch drive electrodes have identical potentials (the third configuration).

According to the third configuration, during a period while the touch drive electrodes used for both of the detection of a touch position and the detection of pressing have identical potentials, amounts of change in electrostatic capacitances generated between the touch drive electrodes and the pressing detection electrode are detected, whereby pressing can be detected with good accuracy.

The second or third configuration may be further characterized in that the control unit compares the voltage change amounts output from the conversion circuit, with a threshold value that is preliminarily prepared, thereby detecting a pressing level (the fourth configuration).

According to the fourth configuration, the pressing level is detected by comparing the voltage change amounts with a preliminarily prepared threshold value. This makes it possible to simply detect a pressing level, in a case where it is not necessary to detect pressing accurately based on voltage change amounts Any one of the first to fourth configurations may be further characterized in that the pressing detection electrode is arranged in each of a plurality of areas obtained by dividing an active area in which a touch position can be detected (the fifth configuration).

According to the fifth configuration, in each of a plurality of areas in the active area, pressing can be detected independently.

EMBODIMENTS

The following description describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of a part of constituent members is omitted. Further, the dimension ratios of the constituent members illustrated in the drawings do not necessarily indicate the real dimension ratios.

Embodiment 1

Figure 1:
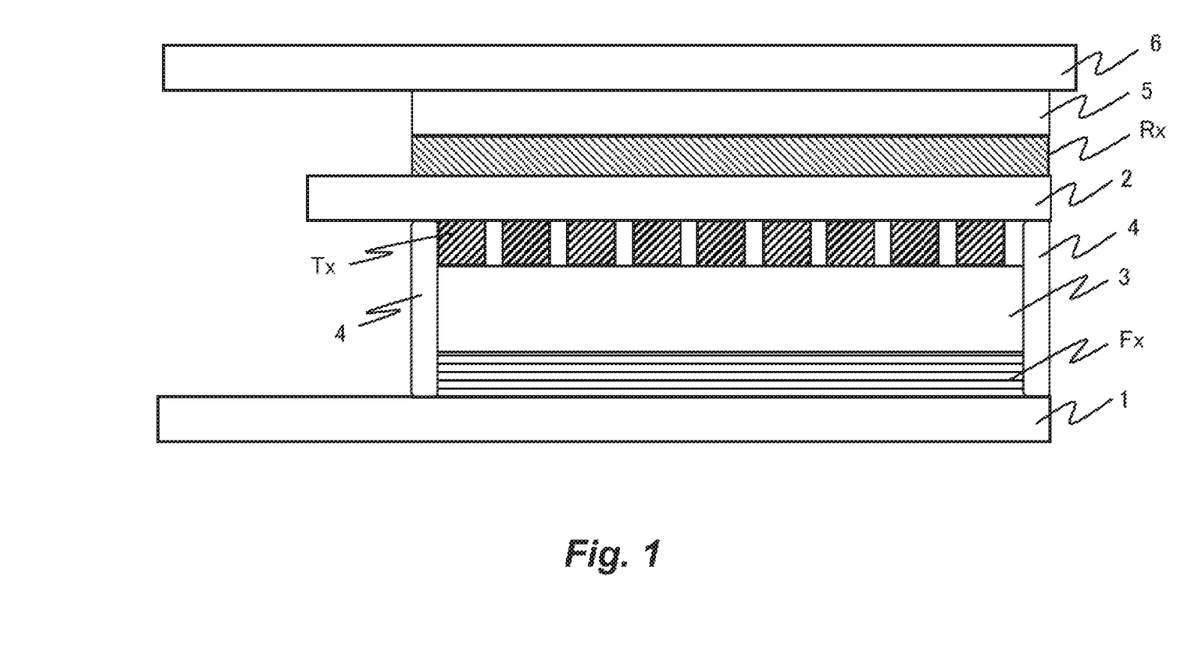
FIG. 1 is a cross-sectional view illustrating a schematic configuration of a liquid crystal panel capable of sensing a touch in Embodiment 1.

FIG. 1 is a cross-sectional view illustrating a schematic configuration of a liquid crystal panel capable of sensing a touch in Embodiment 1. The liquid crystal panel capable of sensing a touch in the present embodiment can be used in, for example, a mobile phone (a smartphone, etc.), a notebook computer (a tablet-type notebook computer, etc.), a portable information terminal (an electronic book, a PDA, etc.), a digital photoframe, a display of an automotive navigation system, a portable game machine, and other various types of electronic equipment.

The liquid crystal panel capable of sensing a touch in Embodiment 1 includes a TFT substrate (a first substrate) 1, a CF substrate (a second substrate) 2, a liquid crystal layer 3, touch drive electrodes Tx, touch detection electrodes Rx, a pressing detection electrode Fx, a sealing member 4, an optical adhesive film 5, and a cover glass 6. In FIG. 1, the side on which the cover glass 6 is provided is the display surface side, and the side on which the TFT substrate 1 is provided is the back side. The surface to which a touch operation is performed with a user's finger or the like is therefore the surface on the cover glass 6 side. A backlight (no illustrated) is provided on the back side of the TFT substrate 1 too.

The liquid crystal layer 3 is interposed between the TFT substrate 1 and the CF substrate 2, which are arranged so as to be opposed to each other, and contains liquid crystal molecules that are a substance whose optical properties vary with a voltage applied thereto. The sealing member 4 is provided around the circumference of the liquid crystal layer 3 so as to surround the liquid crystal layer 3.

Each of the TFT substrate 1 and the CF substrate 2 is formed with a glass substrate that is almost transparent (that has a high translucency). On inner surface sides of the TFT substrate 1 and the CF substrate 2, alignment films (not shown) are formed, respectively, which are intended to align the liquid crystal molecules contained in the liquid crystal layer 3. Further, on outer surface sides of the TFT substrate 1 and the CF substrate 2, polarizing plates (not shown) are attached thereto, respectively.

The touch drive electrodes Tx and the touch detection electrodes Rx are electrodes for detecting a touch position (position coordinates). The touch drive electrodes Tx are provided on the inner surface side (liquid crystal layer 3 side) of the CF substrate 2, and the touch detection electrodes Rx are provided on the display surface side (side opposite to the liquid crystal layer 3) of the CF substrate 2. The touch drive electrodes Tx and the touch detection electrodes Rx are connected to a controller (control unit) 30 (see FIG. 3).

When a driving signal is sent from the controller 30 to the touch drive electrodes Tx, electric fields are formed between the touch drive electrodes Tx and the touch detection electrodes Rx. When, for example, a user's finger touches the surface of the liquid crystal panel in this state, the electric field between the touch drive electrode Tx and the touch detection electrode Rx at the touch position is shielded, whereby the electrostatic capacitance decreases. The controller 30, when receiving a detection signal from the touch detection electrode Rx, detects a difference between the electrostatic capacitance in the state in which the surface of the liquid crystal panel is not touched and the electrostatic capacitance in the state in which the surface is touched, thereby detecting the touch position.

The surface on the display surface side of the CF substrate 2 is attached to cover glass 6 with the optical adhesive film 5 being interposed therebetween. The cover glass 6 is formed with is made of glass that is almost transparent (that has a high translucency).

On the inner surface side (liquid crystal layer 3 side) of the TFT substrate 1, the pressing detection electrode Fx is provided. Each pressing detection electrode Fx is formed with a transparent electrode made of ITO or the like. As illustrated in FIG. 1, between the pressing detection electrode Fx and the touch drive electrodes Tx, the liquid crystal layer 3 is interposed, and electrostatic capacitors are formed. When a user's finger or the like touches the surface of the liquid crystal panel, the distances between the pressing detection electrode Fx and the touch drive electrodes Tx change, whereby the capacitances of the electrostatic capacitors change. By detecting this electrostatic capacitance change amounts, the pressing upon the touch is detected.

In other words, the touch drive electrodes Tx are paired with the touch detection electrodes Rx, respectively, so as to be used for detecting a touch position, and at the same time, they are paired with the pressing detection electrode Fx so as to be used for detecting pressing when touched.

Though not illustrated since it is not directly related to the present invention, a plurality of thin film transistors (TFTs) as switching elements and a plurality of pixel electrodes are arranged in matrix on an inner-side surface of the TFT substrate 1. More specifically, the pressing detection electrode Fx is arranged on the TFT substrate 1, and the TFTs as well as the pixel electrodes are arranged on the pressing detection electrode Fx with the insulating layer being interposed therebetween. Around the TFTs and the pixel electrodes, gate lines and source lines are arranged so as to be in a lattice form. Further, on the inner-side surface of the CF substrate 2, a color filter is provided in which color forming parts of red color (R), green color (G), blue color (B), and the like are arranged in matrix. The color forming parts in the color filter are arranged so as to be superposed on the pixel electrodes, respectively, in a plan view.

Figure 2:
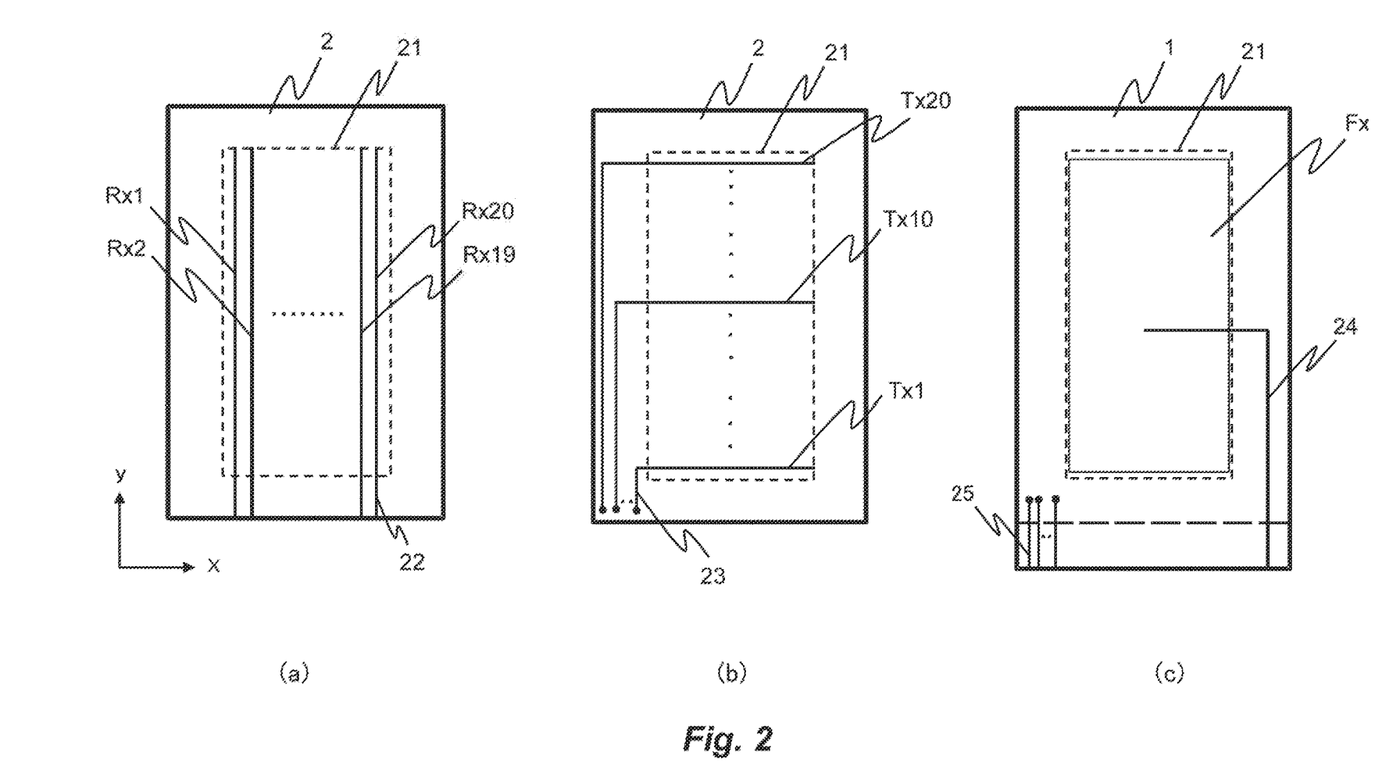
FIG. 2 is a plan view illustrating positions at which touch detection electrodes, touch drive electrodes, and a pressing detection electrode are arranged.

(a) to (c) of FIG. 2 are plan views that illustrate an area where the touch detection electrodes Rx are arranged, an area where the touch drive electrodes Tx are arranged, and an area where the pressing detection electrode Fx is arranged, respectively. (a) of FIG. 2 illustrates the display-side surface of the CF substrate 2, (b) of FIG. 2 illustrates the inner-side surface of the CF substrate 2 (the surface on the liquid crystal layer 3 side), and (c) of FIG. 2 illustrates the inner-side surface of the TFT substrate 1 (the surface on the liquid crystal layer 3 side). In (a) to (c) of FIG. 2, the X-axis direction is the direction in which gate lines (not illustrated) extend (the direction of the short side of the liquid crystal panel), and the Y-axis direction is the direction in which source lines (not illustrated) extend (the direction of the long side of the liquid crystal panel). In (a) to (c) of FIG. 2, the area surrounded by broken lines is an active area 21 in which a touch position can be detected.

As illustrated in (a) of FIG. 2, each of the touch detection electrodes Rx extends in the Y-axis direction in the active area 21, and a plurality of the same are arrayed in X-axis direction. Here, in the description, it is assumed that twenty touch detection electrodes Rx1 to Rx20 are provided. Each of the touch detection electrodes Rx1 to Rx20 is connected to a lead-out line 22 that is arranged outside of the active area 21. The lead-out line 22 is connected with the controller 30 provided outside the substrates (the TFT substrate 1 and the CF substrate 2).

As illustrated in (b) of FIG. 2, each of the touch drive electrodes Tx extends in the X-axis direction in the active area 21, and a plurality of the same are arrayed in the Y-axis direction. Here, in the description, it is assumed that twenty touch drive electrodes Tx1 to Tx20 are provided. Each of the touch drive electrodes Tx1 to Tx20 is connected to a lead-out line 23 that is arranged outside of the active area 21. The lead-out lines 23 are connected, via contact holes, to connection lines 25 provided on the TFT substrate 1, and the connection lines 25 are connected with the controller 30 provided outside the substrates (the TFT substrate 1 and the CF substrate 2).

The configuration, however, may be such that the touch detection electrodes Rx extend in the X-axis direction, and the touch drive electrodes Tx extend in the Y-axis direction.

As illustrated in (c) of FIG. 2, the pressing detection electrode Fx is formed in the active area 21, so as to be in a flat plate form. The pressing detection electrode Fx is connected with a lead-out line 24. The lead-out line 24 is connected with the controller 30 provided outside the substrates (the TFT substrate 1 and the CF substrate 2).

As illustrated in (a) to (c) of FIG. 2, the dimension of the long side of the CF substrate 2 is shorter than the dimension of the long side of the TFT substrate 1. The CF substrate 2 is bonded to the TFT substrate 1 in a state in which ends of the both substrates on one side in the long side direction are aligned on each other (the upper ends in FIG. 2). On the side of the other end of the TFT substrate 1 on the other side in the long side direction (the lower end in FIG. 2), there is an area where the CF substrate 2 does not overlap the TFT substrate 1, the area extending over a predetermined range. In this area, a flexible printed circuit (FPC, not illustrated) is mounted. The lead-out lines 22, 24, and the connection lines 25 are connected with the controller 30 provided outside the substrates (the TFT substrate 1 and the CF substrate 2), via the FPC.

FIG. 3 is a diagram for explaining x-y sensing for detecting a touch position, and force sensing for detecting pressing when touched. The x-y sensing and the force sensing are performed by the controller 30.

First of all, the x-y sensing is described. The controller 30 sends a diving signal to the touch drive electrodes Tx1 to Tx20, and receives detection signals from the touch detection electrodes Rx1 to Rx20, thereby determining coordinates of a touch position. In other words, in the x-y sensing, the touch drive electrodes Tx1 to Tx20 and the touch detection electrodes Rx1 to Rx20 are used.

Next, the force sensing is described. The controller 30 detects amounts of changes in electrostatic capacitances generated between the touch drive electrodes Tx1 to Tx20 and the pressing detection electrode Fx, thereby detecting pressing. In other words, in the force sensing, the touch drive electrodes Tx1 to Tx20 and the pressing detection electrode Fx are used.

Figure 4:
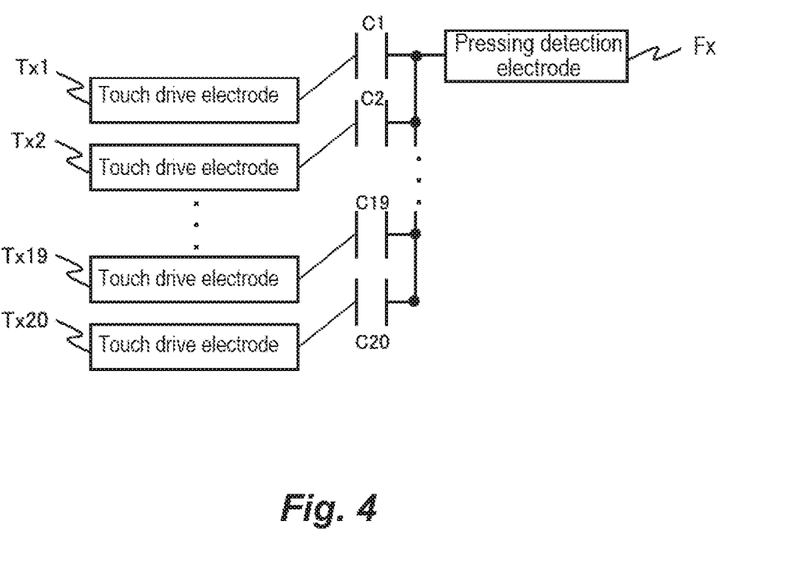
FIG. 4 is an equivalent circuit diagram illustrating electrostatic capacitors formed between touch drive electrodes and a pressing detection electrode.

FIG. 4 is an equivalent circuit diagram illustrating electrostatic capacitors formed between touch drive electrodes Tx1 to Tx20 and the pressing detection electrode Fx. Between the touch drive electrodes Tx1 to Tx20 and the pressing detection electrode Fx, electrostatic capacitances C1 to C20 are generated, respectively. In the equivalent circuit schematic, as illustrated in FIG. 4, the state is such that capacitors having electrostatic capacitances C1 to C20 are connected in parallel.

Figure 5:
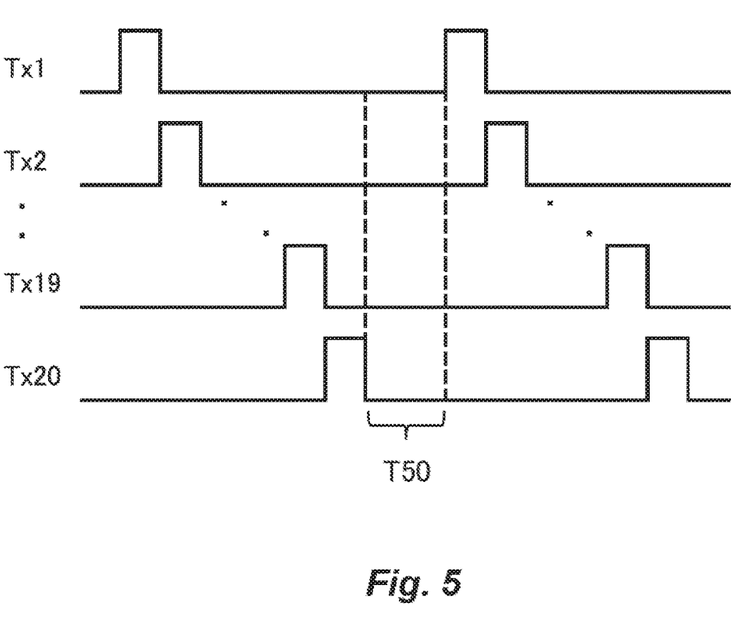
FIG. 5 illustrates voltage levels of touch drive electrodes varying with time in the sequential driving system.

FIG. 5 is a diagram for explaining timings at which the x-y sensing and the force sensing are to be performed, and illustrates voltage levels of the touch drive electrodes Tx1 to Tx20 varying with time. FIG. 5 illustrates a case of the sequential driving system in which touch a driving signal is sequentially applied to the drive electrodes Tx1 to Tx20 while the x-y sensing is performed.

In FIG. 5, the period in which all of the touch drive electrodes Tx1 to Tx20 have identical potentials is referred to as an identical-potential period T50. In this identical-potential period T50, signals at the same low level are supplied to all of the touch drive electrodes Tx1 to Tx20, respectively. In the identical-potential period T50, therefore, the potentials of the touch drive electrodes Tx1 to Tx20 are not 0. Further, since the pressing detection electrode Fx is in a shape of one flat plate, it has one uniform potential.

The force sensing is performed during the identical-potential period T50 while all of the touch drive electrodes Tx1 to Tx20 have identical potentials. As described above, when a user's finger or the like touches the surface of the liquid crystal panel, the electrostatic capacitances C1 to C20 between the touch drive electrodes Tx1 to Tx20 and the pressing detection electrode Fx change at the touched position. By detecting these changes in the electrostatic capacitances C1 to C20, the pressing when touched is detected. The liquid crystal panel capable of sensing a touch in the present embodiment includes a C-V conversion circuit for detecting the electrostatic capacitance change amount as a voltage change amount. The C-V conversion circuit is formed, for example, in the controller 30.

Figure 6:
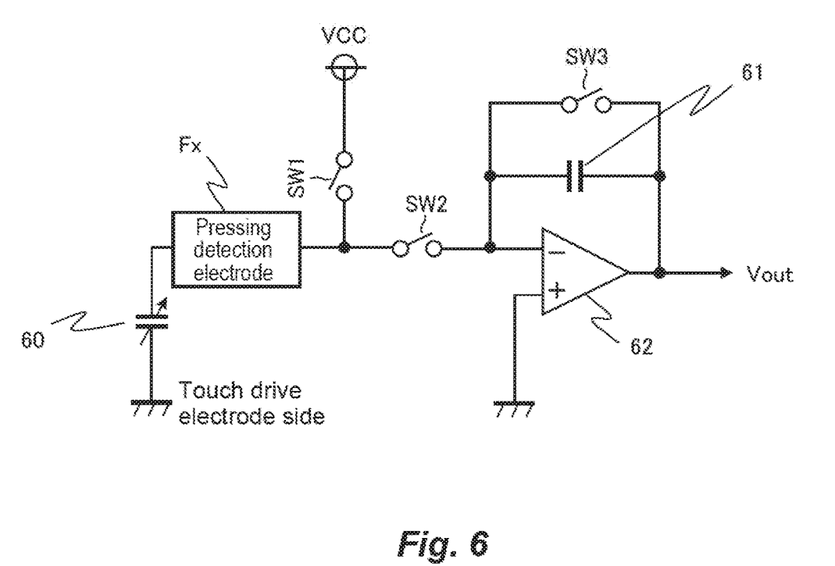
FIG. 6 illustrates an exemplary C-V conversion circuit for detecting an electrostatic capacitance change amount as a voltage change amount.

FIG. 6 illustrates an exemplary C-V conversion circuit for detecting an electrostatic capacitance change amount as a voltage change amount. FIG. 6 illustrates an equivalent circuit during the identical-potential period T50 while the touch drive electrodes Tx1 to Tx20 have identical potentials. The C-V conversion circuit includes switching elements SW1 to SW3, a feedback capacitor 61, and an operational amplifier 62. The feedback capacitor 61 has a capacitance Cref. The configuration of the C-V conversion circuit, however, is not limited to the configuration illustrated in FIG. 6.

A capacitor 60 illustrated in FIG. 6 collectively represents electrostatic capacitors formed between the touch drive electrodes Tx1 to Tx20 and the pressing detection electrode Fx, and has a capacitance sum Csum that is expressed by the following expression (1):

$$Csum = C1 + C2 + \ldots + C19 + C20 \quad (1)$$

One end of the switching element SW1 is connected with the pressing detection electrode Fx, and the other end thereof is connected to a voltage source for a voltage VCC. The pressing detection electrode Fx is connected with a reverse input terminal of the operational amplifier 62 through the switching element SW2. The operational amplifier 62 has a non-reverse input terminal that is grounded. To a feedback path that connects the output terminal and the reverse input terminal of the operational amplifier 62, a parallel circuit composed of the switching element SW3 and the feedback capacitor 61 is connected.

The following description briefly describes operations of the C-V conversion circuit illustrated in FIG. 6. First, the switching elements SW1 and SW3 are turned on, and the switching element SW2 is turned off. In this state, based on the voltage VCC of the voltage source, the capacitor 60 are charged with electric charges. No charge is charged to the feedback capacitor 61.

Subsequently, the switching elements SW1 and SW3 are turned off, and thereafter, the switching element SW2 is turned on. This causes the charges in the capacitor 60 to be transferred to the feedback capacitor 61, whereby the feedback capacitor 61 is charged. The charging voltage of the feedback capacitor 61 is detected as a voltage Vout of the output terminal of the operational amplifier 62 (hereinafter referred to as an output voltage Vout). The output voltage Vout is expressed by the following expression (2):

$$Vout = (Csum/Cref) \times VCC \quad (2)$$

When a user's finger or the like touches the surface of the liquid crystal panel, an amount of change ΔCsum of the electrostatic capacitance Csum varies with the magnitude of the force of the pressing. In other words, as the force of the pressing is greater, the change ΔCsum of the electrostatic capacitance Csum is greater. According to the expression (2), the change ΔVout of the output voltage Vout when the electrostatic capacitance Csum changes is expressed by the following expression (3):

$$\Delta Vout = (\Delta Csum/Cref) \times VCC \quad (3)$$

In other words, by detecting the ΔVout of the output voltage Vout, the pressing can be detected.

Figure 7:
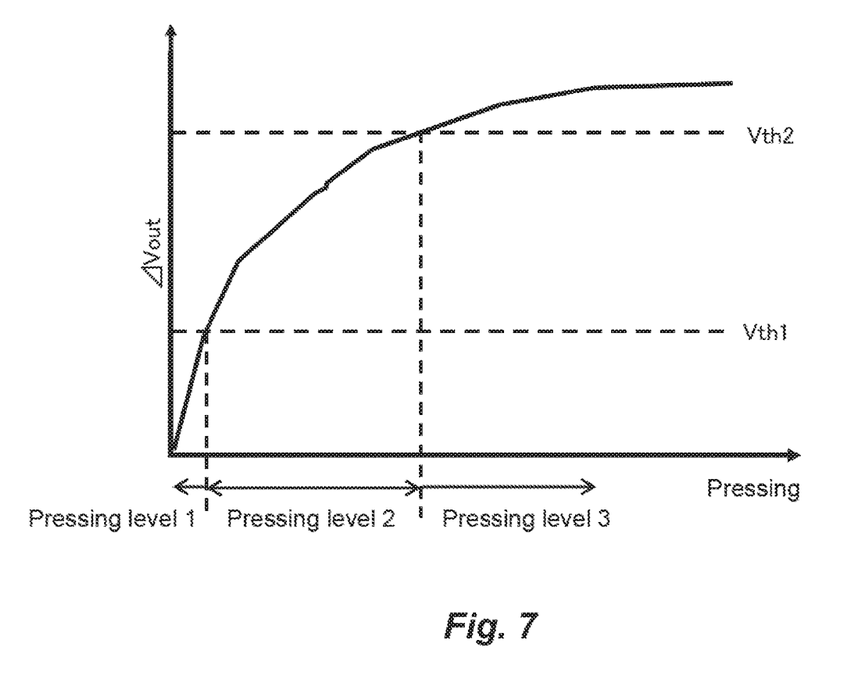
FIG. 7 illustrates an exemplary relationship between a pressing force and an output voltage change amount of an operational amplifier.

FIG. 7 illustrates an exemplary relationship between the pressing and the change ΔVout of the output voltage Vout. As illustrated in FIG. 7, as the pressing has a greater magnitude, the change ΔVout of the output voltage Vout increases.

Here, a plurality of threshold values to be compared with the change ΔVout of the output voltage Vout may be set preliminarily, so that the pressing can be detected at a plurality of grades (a plurality of levels). In FIG. 7, an example case in which two threshold values, which are a first threshold value Vth1 and a second threshold value Vth2 (Vth2>Vth1), are set. In this case, the magnitude of the pressing can be detected at three levels. The threshold values are set according to a pressing level to be detected.

"Pressing level 1" is a level in a case where the change ΔVout of the output voltage Vout is smaller than a first threshold value Vth1. "Pressing level 1" corresponds to pressing at such a level of, for example, touching the surface of the liquid crystal panel.

"Pressing level 2" is a level in a case where the change ΔVout of the output voltage Vout is equal to or greater than the first threshold value Vth1, and smaller than a second threshold value Vth2. "Pressing level 2" corresponds to pressing at such a level of, for example, pressing the surface of the liquid crystal panel.

"Pressing level 3" is a level in a case where the change ΔVout of the output voltage Vout is equal to or greater than the second threshold value Vth2. "Pressing level 3" corresponds to pressing at such a level of strongly pressing the surface of the liquid crystal panel.

The detection of the pressing is not limited to the above-described detection at the three levels. For example, the detection may be such that only one threshold value to be compared with the change ΔVout of the output voltage Vout is prepared, so that pressing can be detected at two levels, or may be such that three or more threshold values are prepared so that pressing can be detected at four or more levels.

Further, the magnitude of pressing can be detected by preliminarily preparing table data indicating the relation between pressing and the change ΔVout of the output voltage Vout as illustrated in FIG. 7, and referring to the table data, based on the change ΔVout of the output voltage Vout. By this method, the magnitude of pressing is detected not roughly at a plurality of levels, but can be detected finely as a value.

In the case of the liquid crystal panel capable of sensing a touch in Embodiment 1, the pressing detection electrode Fx for detecting pressing is provided on the TFT substrate 1 already existing, and the touch drive electrodes Tx for detecting a touch position are used also for detecting pressing. It is therefore unnecessary to additionally arrange a pair of electrodes for detecting pressing, or to additionally arrange another substrate, whereby the liquid crystal panel in Embodiment 1 has a thickness that is almost equal to the thickness of a liquid crystal panel that does not have a pressing detection function. Besides, since no air layer is present between the pressing detection electrode Fx and the touch drive electrodes Tx but only the liquid crystal layer 3 is interposed therebetween, a problem of interface reflection caused by the presence of the air layer by no means occurs. This makes it possible to detect a touch position and pressing without impairing display quality.

As described above, the pressing detection electrode Fx arranged on the TFT substrate 1 is formed with a transparent electrode made of ITO or the like, whereby a decrease in the aperture ratio caused by the provision of the pressing detection electrode Fx can be suppressed. Further, since the C-V conversion circuit for detecting pressing is provided in the controller 30, which is provided outside the substrates (the TFT substrate 1 and the CF substrate 2), it is unnecessary to arrange the switching elements SW1 to SW3, the feedback capacitor 61, the operational amplifier 62 and the like, which compose the C-V conversion circuit, on the TFT substrate 1. The aperture ratio therefore by no means decreases.

Embodiment 2

In Embodiment 1, one pressing detection electrode Fx is arranged in the active area 21. In Embodiment 2, two pressing detection electrodes Fx are arranged in the active area 21.

Figure 8:
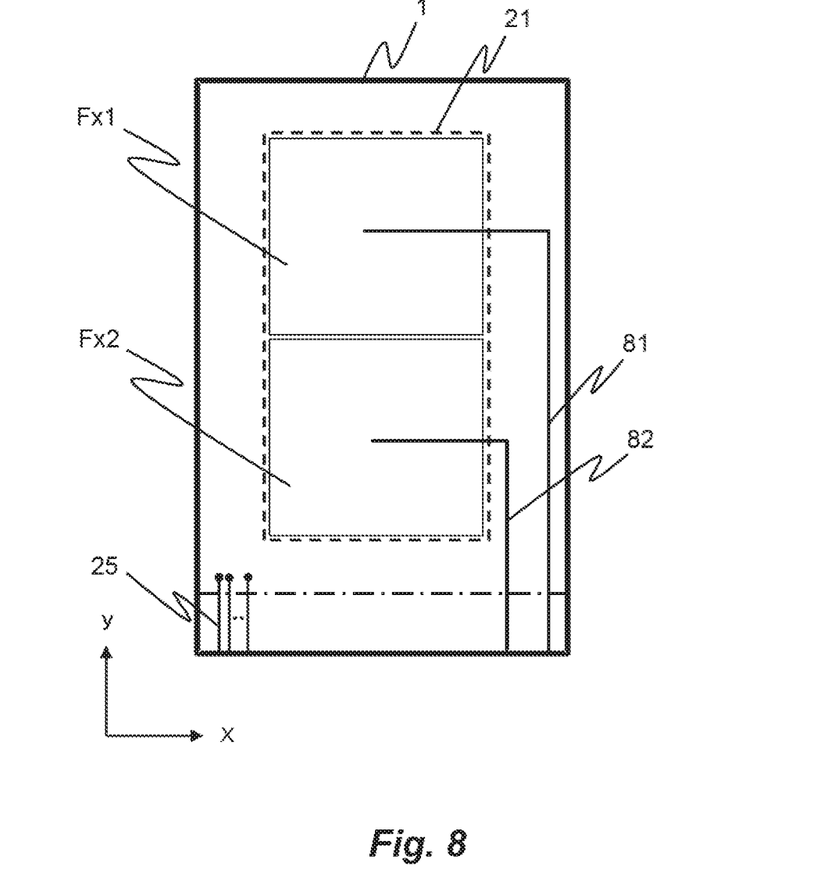
FIG. 8 is a plan view illustrating positions at which two pressing detection electrodes are arranged, in Embodiment 2.

FIG. 8 is a plan view illustrating areas where two pressing detection electrodes Fx1, Fx2 are arranged, respectively; the plan view illustrates the inner-side surface of the TFT substrate 1 (the surface on the liquid crystal layer 3 side). As illustrated in FIG. 8, in areas obtained by dividing the active area 21 into two in the Y-axis direction, the pressing detection electrodes Fx1 and Fx2 are arranged, respectively. The pressing detection electrode Fx1, arranged in the upper-side area of the active area 21, is connected to the controller 30 via a lead-out line 81. The pressing detection electrode Fx2, arranged in the lower-side area of the active area 21, is connected with the controller 30 via a lead-out line 82.

The controller 30 selects one of the lead-out line 81 and the lead-out line 82. Alternatively, a circuit for selecting one of the lead-out line 81 and the lead-out line 82 may be formed in a frame region on the TFT substrate 1.

Figure 9:
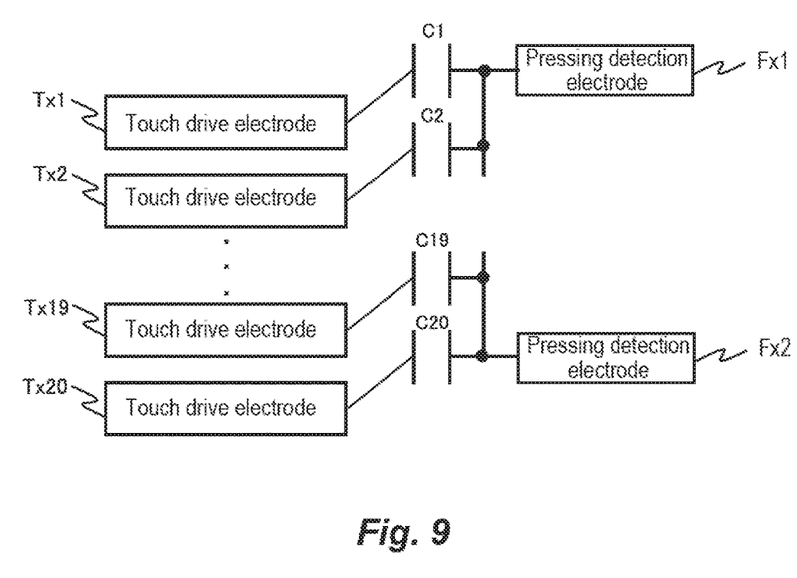
FIG. 9 is an equivalent circuit diagram illustrating electrostatic capacitors formed between touch drive electrodes and pressing detection electrodes in Embodiment 2.

FIG. 9 is an equivalent circuit diagram illustrating electrostatic capacitors formed between touch drive electrodes Tx1 to Tx20 and pressing detection electrodes Fx1, Fx2. The touch drive electrodes Tx1 to Tx10 are arranged in the area opposed to the area where the pressing detection electrode Fx1 is arranged in a plan view. Further, the touch drive electrodes Tx11 to Tx20 are arranged in the area opposed to the area where the pressing detection electrode Fx2 is arranged in a plan view. Between the touch drive electrodes Tx1 to Tx10 and the pressing detection electrode Fx1, capacitors are formed that have electrostatic capacitances C1 to C10, respectively. The capacitors having the electrostatic capacitances C1 to C10 are in a state of being connected in parallel. Further, between the touch drive electrodes Tx11 to Tx20 and the pressing detection electrode Fx2, capacitors are formed that have electrostatic capacitances C11 to C20, respectively. The capacitors having electrostatic capacitances C11 to C20 are in a state of being connected in parallel.

Figure 10:
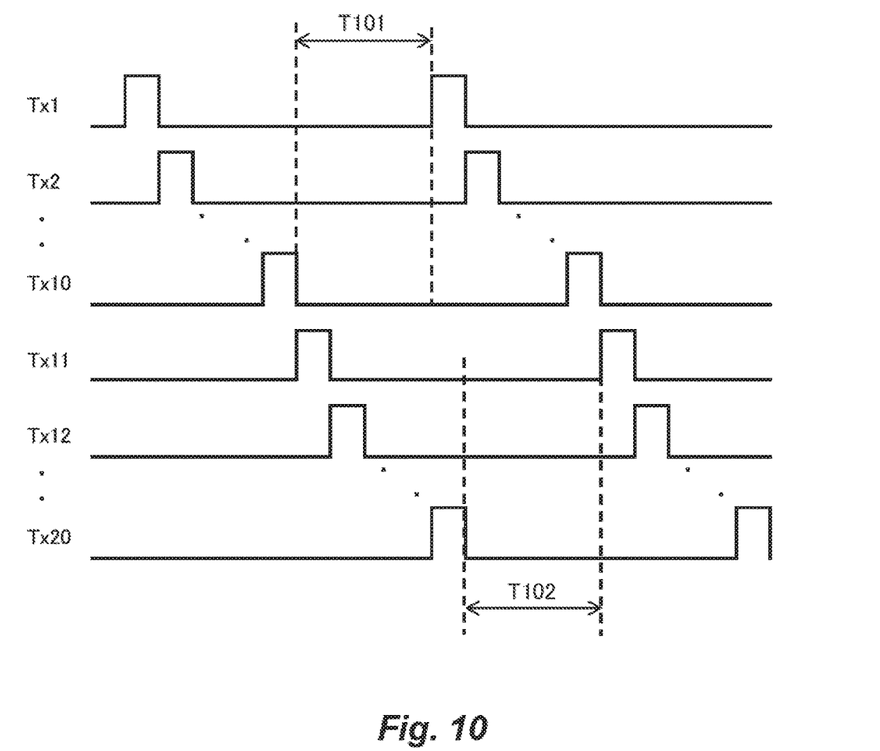
FIG. 10 illustrates voltage levels of touch drive electrodes varying with time in Embodiment 2.

FIG. 10 is a diagram for explaining timings at which the x-y sensing and the force sensing are to be performed in the present embodiment, and illustrates voltage levels of touch drive electrodes Tx1 to Tx20 varying with time. FIG. 10 illustrates a case of the sequential driving system in which touch a driving signal is sequentially applied to the drive electrodes Tx1 to Tx20.

A first identical-potential period T101 is a period in which the period in which the touch drive electrodes Tx1 to Tx10 have identical potentials, and a second identical-potential period T102 is a period in which the touch drive electrodes Tx11 to Tx20 have identical potentials. In the first identical-potential period T101, signals at the same low level are supplied to the touch drive electrodes Tx1 to Tx10, respectively, and in the second identical-potential period T102, signals at the same low level are supplied to the touch drive electrodes Tx11 to Tx20, respectively.

The force sensing in the area where the pressing detection electrode Fx1 is provided is performed during the first identical-potential period T101 while the touch drive electrodes Tx1 to Tx10 have identical potentials. A sum Csum1 of electrostatic capacitances generated between the touch drive electrodes Tx1 to Tx10 and the pressing detection electrode Fx1 during the first identical-potential period T101 is expressed by the following expression (4):

$$Csum1 = C1 + C2 + \ldots + C9 + C10 \quad (4)$$

The force sensing in the area where the pressing detection electrode Fx2 is provided is performed during the second identical-potential period T102 while the touch drive electrodes Tx11 to Tx20 have identical potentials. A sum Csum2 of electrostatic capacitances generated between the touch drive electrodes Tx11 to Tx20 and the pressing detection electrode Fx2 during the second identical-potential period T102 is expressed by the following expression (5):

$$Csum2 = C11 + C12 + \ldots + C19 + C20 \quad (5)$$

Figure 11:
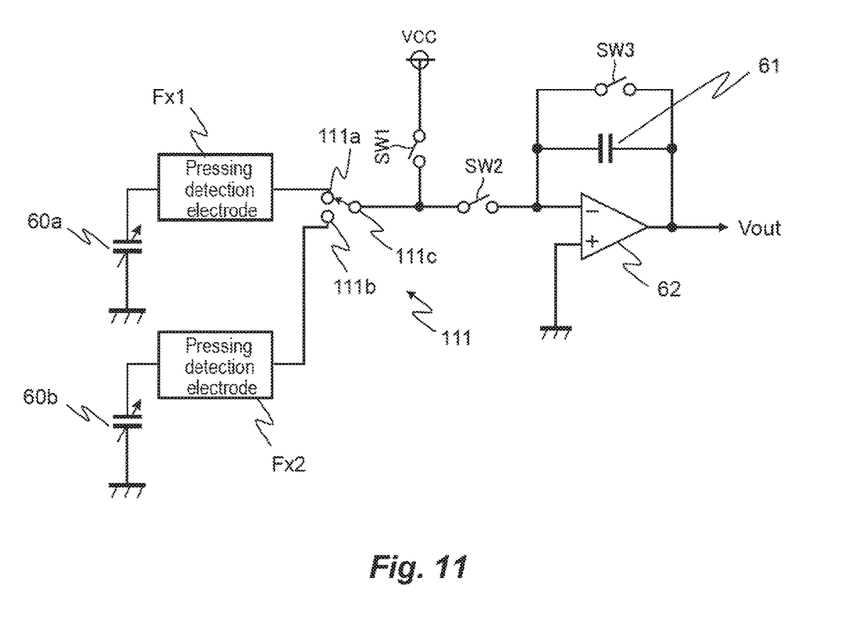
FIG. 11 illustrates an exemplary C-V conversion circuit for detecting an electrostatic capacitance change amount as a voltage change amount in Embodiment 2.

FIG. 11 illustrates an exemplary C-V conversion circuit for detecting an electrostatic capacitance change amount as a voltage change amount. FIG. 11 illustrates an equivalent circuit during the identical-potential periods while the touch drive electrodes Tx1 to Tx20 have identical potentials. In FIG. 11, components identical to those of the circuit illustrated in FIG. 6 are denoted by identical reference symbols, and detailed descriptions of the same are omitted. A capacitor 60a illustrated in FIG. 11 collectively represents capacitors formed between the touch drive electrodes Tx1 to Tx10 and the pressing detection electrode Fx1, and has an electrostatic capacitance sum Csum1. Further, a capacitor 60b collectively represents capacitors formed between the touch drive electrodes Tx11 to Tx20 and the pressing detection electrode Fx2, and has an electrostatic capacitance sum Csum2.

An input terminal 111a of a multiplexer 111, i.e., one of two input terminals 111a, 111b of the multiplexer 111, is connected with the pressing detection electrode Fx1, and the other terminal 111b is connected with the pressing detection electrode Fx2. An output terminal 111c of the multiplexer 111 is connected with the switching elements SW1 and SW2. The multiplexer 111 is provided in the controller 30. The multiplexer 111 may be provided on the TFT substrate 1. In the case where the multiplexer 111 is provided on the TFT substrate 1, the multiplexer 111 is preferably provided on the frame region, so that the aperture ratio should not decrease.

In the present embodiment, pressing can be detected in each of two areas of the active area 21, independently, i.e., in the upper area and the lower area obtained by dividing the active area 21 into two.

During the first potential identical T101 while the touch drive electrodes Tx1 to Tx10 have identical potentials, if the input terminal 111a and the output terminal 111c of the multiplexer 111 are connected, an amount of change ΔVout1 of the output voltage Vout corresponding to an amount of change ΔCsum1 of the electrostatic capacitance Csum1 can be detected (see the expression (6) below). By detecting the amount of change ΔVout1 of the output voltage Vout, pressing in the upper area of the active area 21 thus divided can be detected.

$$\Delta Vout1 = (\Delta Csum1/Cref) \times VCC \quad (6)$$

During the second potential identical T102 while the touch drive electrodes Tx11 to Tx20 have identical potentials, if the input terminal 111b and the output terminal 111c of the multiplexer 111 are connected, an amount of change ΔVout2 of the output voltage Vout corresponding to an amount of change ΔCsum2 of the electrostatic capacitance Csum2 can be detected (see the expression (7) below). By detecting the change ΔVout2 of the output voltage Vout, pressing in the lower area of the active area 21 thus divided can be detected.

$$\Delta Vout2 = (\Delta Csum2/Cref) \times VCC \quad (7)$$

In this way, in the present embodiment, pressing when touched can be detected independently in each of the two areas obtained by dividing the active area 21 into two. For example, in a case where the liquid crystal panel capable of sensing a touch in the present embodiment is used in a smartphone, the smartphone may be placed in the landscape orientation so that the right hand thumb and the left hand thumb are arranged on the left and right sides of the screen, respectively, so that a game application that allows different operation instructions to be made with pressing by the left hand thumb and with pressing by the right hand thumb can be played.

The above-described embodiment is merely an example for implementing the present invention. The present invention, therefore, is not limited to the above-described embodiment, and the above-described embodiment can be appropriately varied and implemented without departing from the spirit and scope of the invention.

For example, in Embodiment 2, in the two areas obtained by dividing the active area 21 in the Y-axis direction into two, the pressing detection electrodes Fx1 and Fx2 are arrange respectively; alternatively, however, the pressing detection electrodes may be respectively arranged in the areas obtained by dividing the active area 21 in the X-axis direction into two. Further alternatively, the configuration may be such that the active area is divided into three or more areas, and pressing detection electrodes are arranged respectively in the areas obtained by division. In this case, pressing can be detected independently in each of the three or more areas.

The present invention is not limited by the liquid crystal panel driving method. For example, the liquid crystal panel is not limited to the liquid crystal panel in the above-described embodiments in which pairs of electrodes are provided with the liquid crystal layer 3 being interposed therebetween so that liquid crystal molecules are driven by vertical electric fields that are vertical to the TFT substrate 1; the liquid crystal panel may be an IPS-type liquid crystal panel capable of sensing a touch in which pairs of electrodes are provided on the liquid crystal layer 3 side of the TFT substrate 1 and liquid crystal molecules are driven by horizontal electric fields in the direction parallel to the TFT substrate 1 that are generated by applying voltages to the pairs of electrodes.

DESCRIPTION OF REFERENCE NUMERALS

1: TFT substrate
2: CF substrate
3: liquid crystal layer
21: active area
30: controller
Tx (Tx1 to Tx20): touch drive electrode
Rx (Rx1 to Rx20): touch detection electrode
Fx (Fx1 to Fx2): pressing detection electrode

The invention claimed is:

1. A liquid crystal panel capable of sensing a touch, comprising:
    a first substrate;
    a second substrate arranged so as to be opposed to the first substrate;
    a liquid crystal layer interposed between the first substrate and the second substrate;
    touch drive electrodes arranged on a liquid crystal layer side of the second substrate;
    a touch detection electrode arranged on a side of the second substrate opposite to the liquid crystal layer;
    a pressing detection electrode arranged on a liquid crystal layer side of the first substrate; and
    a control unit that supplies a driving signal to the touch drive electrodes, and detects a detection signal output from the touch detection electrode, thereby detecting a touch position, and that detects amounts of change in electrostatic capacitances generated between the touch drive electrodes and the pressing detection electrode, thereby detecting pressing when touched.

2. The liquid crystal panel capable of sensing a touch according to claim 1, further comprising:
    a conversion circuit that convers the amounts of change in the electrostatic capacitances generated between the touch drive electrodes and the pressing detection electrode, to voltage change amounts,
    wherein the control unit detects pressing when touched, based on the voltage change amounts output from the conversion circuit.

3. The liquid crystal panel capable of sensing a touch according to claim 2,
    wherein, when detecting pressing when touched, the control unit detects amounts of change in the electrostatic capacitances generated between the touch drive electrodes and the pressing detection electrode, during a period while the touch drive electrodes have identical potentials.

4. The liquid crystal panel capable of sensing a touch according to claim 2,
    wherein the control unit compares the voltage change amounts output from the conversion circuit, with a threshold value that is preliminarily prepared, thereby detecting a pressing level.

5. The liquid crystal panel capable of sensing a touch according to claim 1,
wherein the pressing detection electrode is arranged in each of a plurality of areas obtained by dividing an active area in which a touch position can be detected.

* * * * *